United States Patent
Hasegawa

(10) Patent No.: US 7,935,384 B2
(45) Date of Patent: May 3, 2011

(54) FILM FORMING METHOD

(75) Inventor: Toshio Hasegawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1159 days.

(21) Appl. No.: 10/488,405

(22) PCT Filed: Sep. 2, 2002

(86) PCT No.: PCT/JP02/08878
§ 371 (c)(1),
(2), (4) Date: Mar. 3, 2004

(87) PCT Pub. No.: WO03/021650
PCT Pub. Date: Mar. 13, 2003

(65) Prior Publication Data
US 2004/0235191 A1 Nov. 25, 2004

(30) Foreign Application Priority Data
Sep. 3, 2001 (JP) .................................. 2001-265243

(51) Int. Cl.
*C23C 16/34* (2006.01)
(52) U.S. Cl. ....... 427/255.394; 427/255.23; 427/255.28; 427/294; 117/88; 117/93
(58) Field of Classification Search .................. 427/97.2, 427/123, 124, 126.1, 248.1, 249.19, 250, 427/253, 255.11, 255.17, 255.23, 255.26, 427/255.28, 255.36, 255.391, 255.4, 255.7, 427/294, 532, 533, 535, 569, 576, 255.394; 117/88, 93
See application file for complete search history.

(56) References Cited

U.S. PATENT DOCUMENTS
5,306,666 A 4/1994 Izumi
(Continued)

FOREIGN PATENT DOCUMENTS
JP 63-118075 5/1988
(Continued)

OTHER PUBLICATIONS

T. Ohba, et al., "Decomposition Property of Methylhydrazine with Titanium Nitridation at Low Temperature", J. Electrochem. Soc., vol. 142, No. 3, Mar. 1995.
(Continued)

*Primary Examiner* — Bret Chen
(74) *Attorney, Agent, or Firm* — Smith, Gambrell & Russell, LLP

(57) ABSTRACT

The present invention relates to a method of forming a metal-nitride film onto a surface of an object to be processed in a processing container in which a vacuum can be created. The method of the invention includes: a step of continuously supplying an inert gas into a processing container set at a low film-forming temperature; and a step of intermittently supplying a metal-source gas into the processing container, during the step of continuously supplying the inert gas. During the step of intermittently supplying the metal-source gas, a nitrogen-including reduction gas is supplied into the processing container at the same time that the metal-source gas is supplied, during a supply term of the metal-source gas. The nitrogen-including reduction gas is also supplied into the processing container for a term shorter than a non-supply term of the metal-source gas, during the non-supply term of the metal-source gas. According to the invention, a metal-nitride film can be deposited whose chlorine density is low, whose resistivity is low, in which less cracks may be generated, and whose abnormal growth may not be generated.

14 Claims, 15 Drawing Sheets

U.S. PATENT DOCUMENTS

| | | | |
|---|---|---|---|
| 6,051,281 A | 4/2000 | Kobayashi et al. | |
| 6,197,683 B1* | 3/2001 | Kang et al. | 438/643 |
| 6,203,613 B1* | 3/2001 | Gates et al. | 117/104 |
| 6,399,491 B2* | 6/2002 | Jeon et al. | 438/680 |
| 6,482,733 B2* | 11/2002 | Raaijmakers et al. | 438/633 |
| 6,627,268 B1* | 9/2003 | Fair et al. | 427/533 |
| 6,706,115 B2* | 3/2004 | Leskela et al. | 117/84 |
| 6,767,582 B1* | 7/2004 | Elers | 427/253 |
| 6,793,969 B2 | 9/2004 | Shimogaki et al. | |
| 6,855,368 B1* | 2/2005 | Kori et al. | 427/99.1 |
| 6,884,466 B2* | 4/2005 | Kaloyeros et al. | 427/255.392 |
| 6,902,763 B1* | 6/2005 | Elers et al. | 427/250 |
| 7,081,271 B2* | 7/2006 | Chung et al. | 427/255.391 |
| 2001/0009695 A1* | 7/2001 | Saanila et al. | 427/255.39 |
| 2001/0034097 A1 | 10/2001 | Lim et al. | |
| 2002/0155219 A1* | 10/2002 | Wang et al. | 427/255.391 |
| 2002/0182320 A1* | 12/2002 | Leskela et al. | 427/250 |
| 2003/0049931 A1* | 3/2003 | Byun et al. | 438/649 |
| 2003/0143841 A1 | 7/2003 | Yang et al. | |
| 2004/0235191 A1 | 11/2004 | Hasegawa | |
| 2007/0202254 A1* | 8/2007 | Ganguli et al. | 427/252 |

FOREIGN PATENT DOCUMENTS

| | | |
|---|---|---|
| JP | 02-093071 | 4/1990 |
| JP | 06-089873 | 3/1994 |
| JP | 06-314660 | 11/1994 |
| JP | 07-109576 | 4/1995 |
| JP | 08-186173 | 7/1996 |
| JP | 10-106974 | 4/1998 |
| JP | 10-335264 | 12/1998 |
| JP | 2003-077864 | 3/2003 |
| JP | 2003-213418 | 7/2003 |
| WO | 03/008663 A1 | 1/2003 |

OTHER PUBLICATIONS

Communication in Cases for Which NO Other Form Is Applicable (Form PCT/IB/345) issued in connection with PCT/JP2002/008878 (Jul. 1992).

Notification of Transmittal of Translation of the International Preliminary Examination Report (PCT/IB/338) issued in connection with PCT/JP2002/008878 (Jul. 1996).

Translation of International Preliminary Examination Report (PCT/IPEA/409) issued in connection with PCT/JP2002/008878 (Jul. 1998).

Notification of Transmittal of Translation of the International Preliminary Report on Patentability (Form PCT/IB/338)—PCT/JP2004/001476 mailed Feb. 23, 2006.

PCT International Preliminary Report on Patentability (Form PCT/IPEA/409)—PCT/JP2004/001476 mailed Feb. 23, 2006.

* cited by examiner

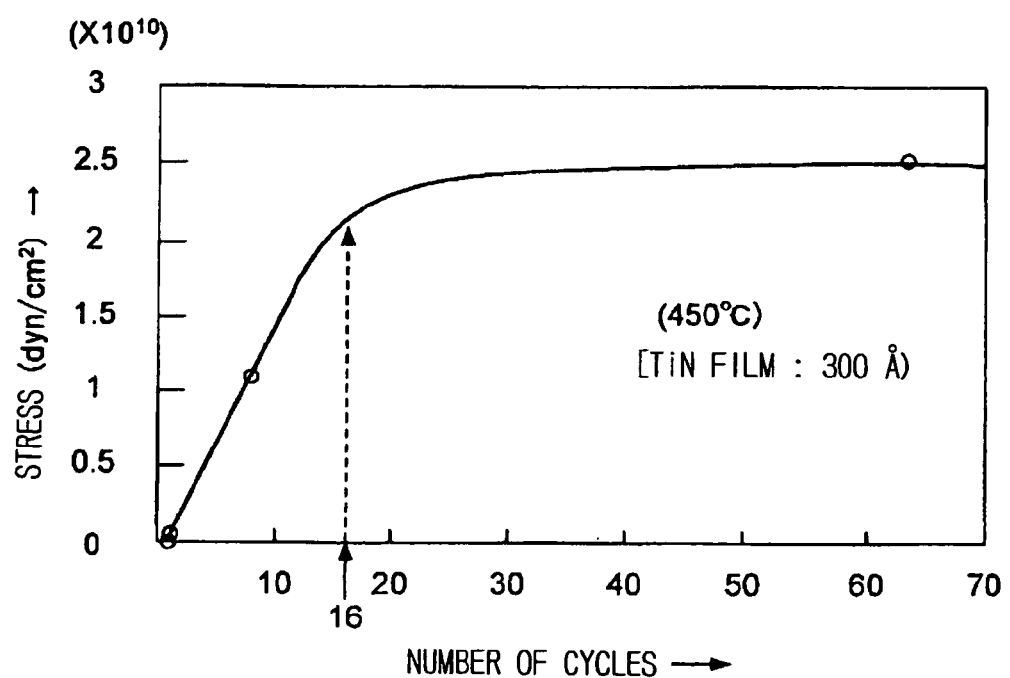
F I G. 5

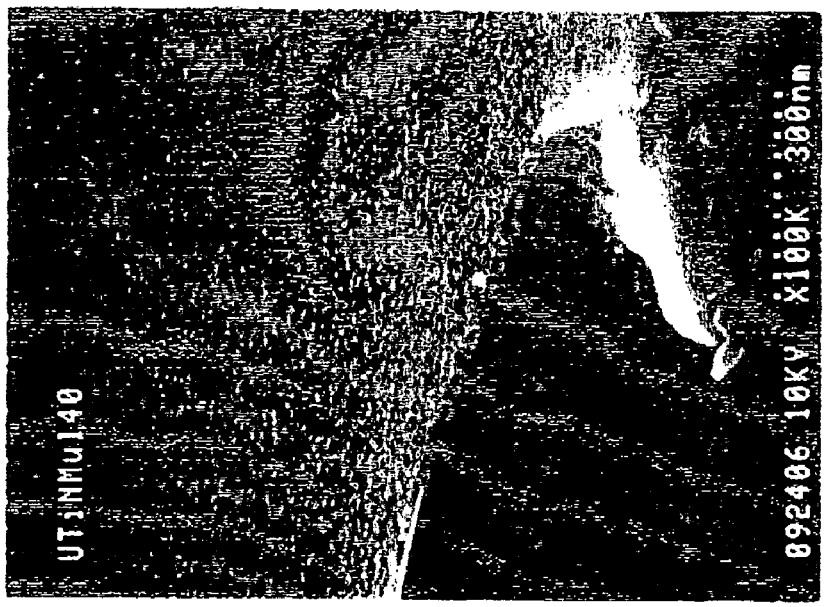
FIG. 6(B) INVENTION METHOD (450 °C : 40CYCLES)
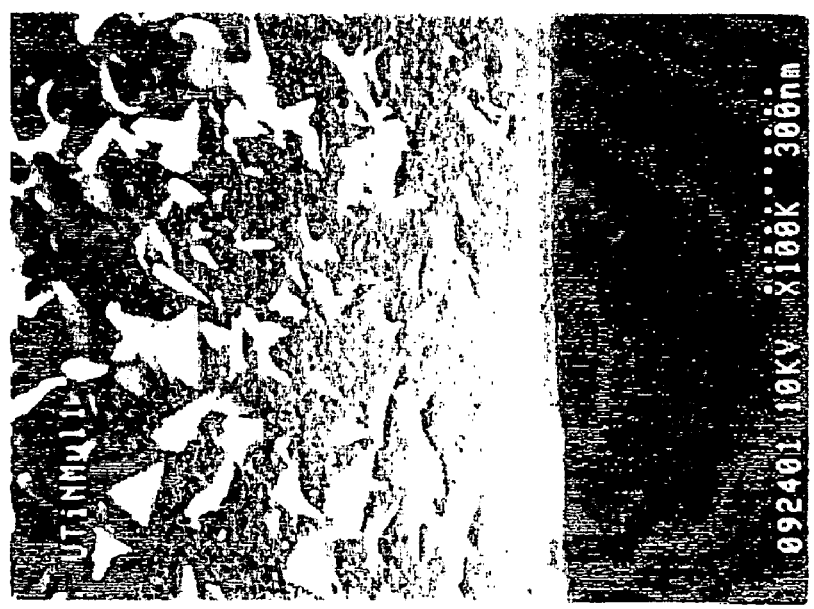
FIG. 6(A) CONVENTIONAL METHOD (450°C)

(THERMAL CVD)
FIRST VARIANT OF FIRST EMBODIMENT (PLASMA CVD)
SECOND VARIANT OF FIRST EMBODIMENT (THERMAL CVD) SECOND EMBODIMENT (THERMAL CVD)
FIRST VARIANT OF SECOND EMBODIMENT (PLASMA CVD)
SECOND VARIANT OF SECOND EMBODIMENT

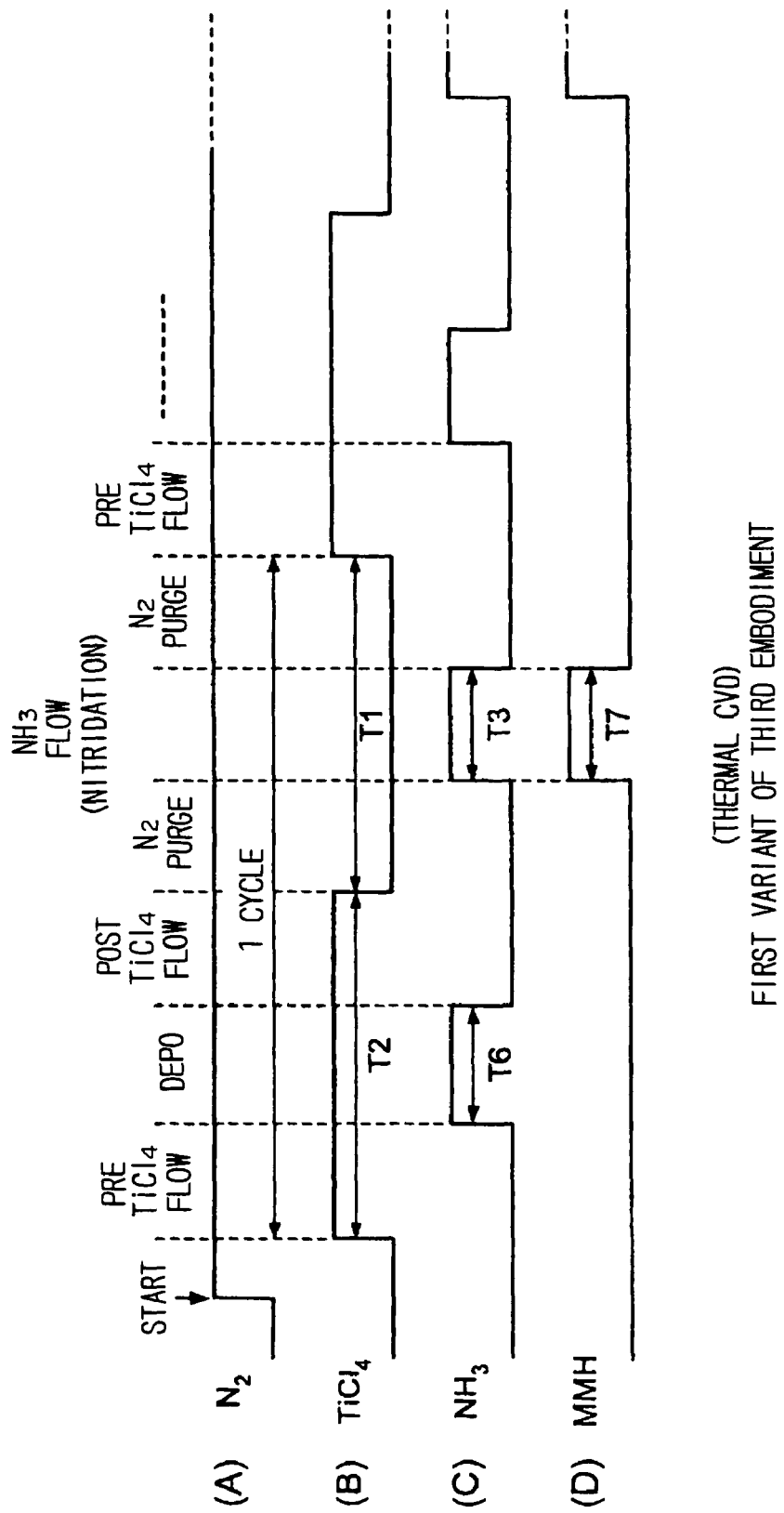
F I G. 13
(THERMAL CVD)
FIRST VARIANT OF THIRD EMBODIMENT

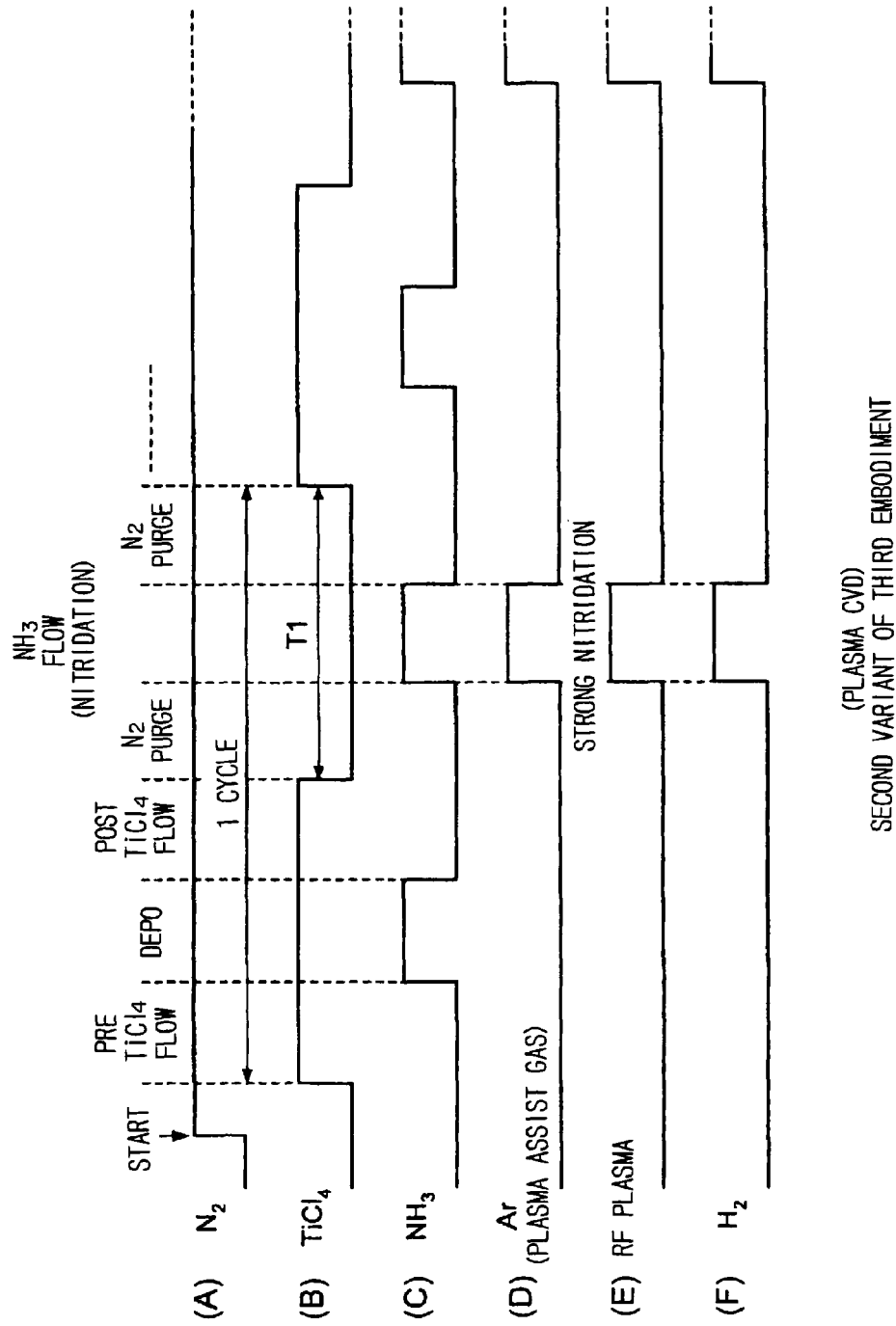
F I G. 14
(PLASMA CVD)
SECOND VARIANT OF THIRD EMBODIMENT

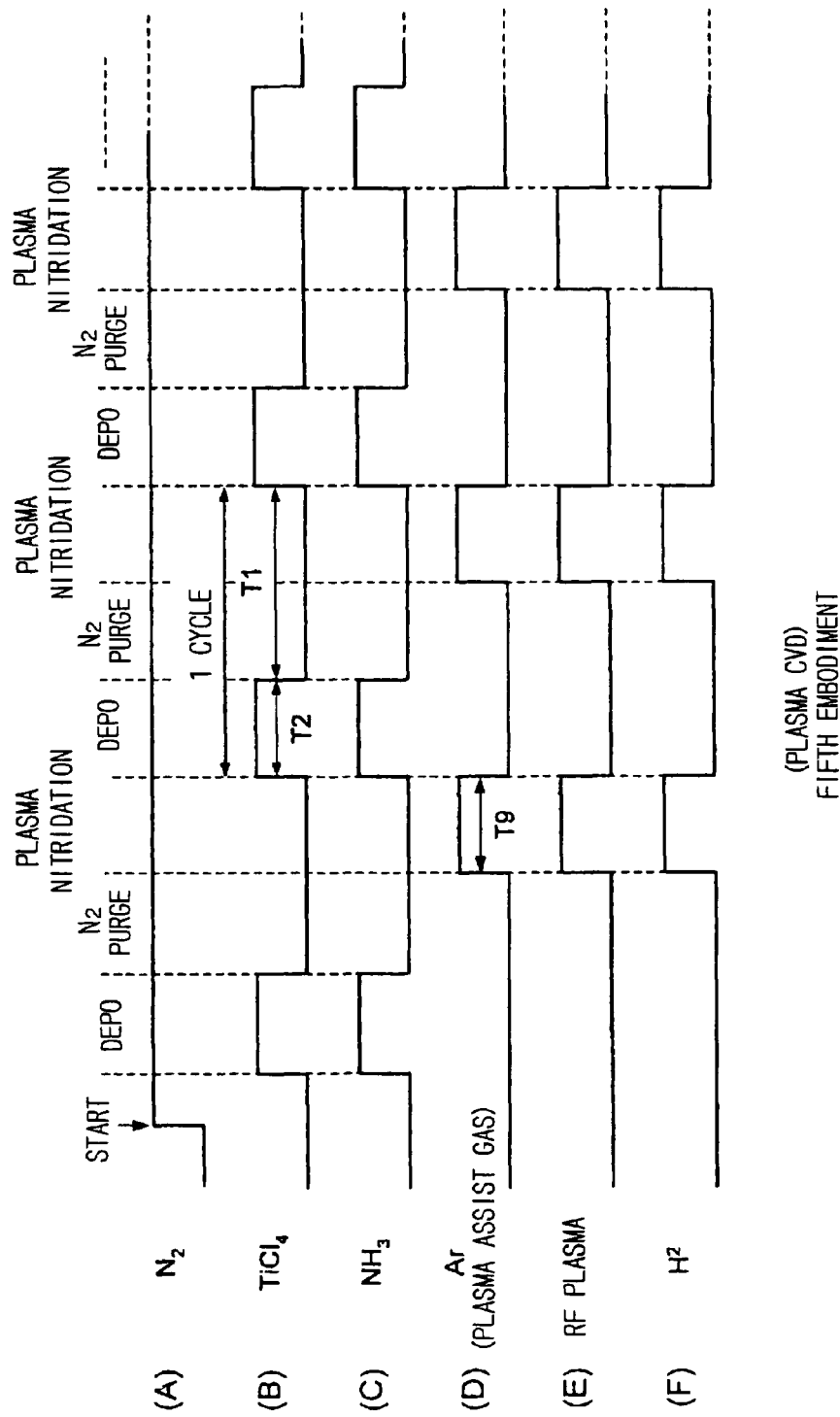

FILM FORMING METHOD

FIELD OF THE INVENTION

The present invention relates to a film-forming method for depositing a metal-nitride film such as a TiN (Titanium nitride) film onto a surface of an object to be processed such as a semiconductor wafer.

DESCRIPTION OF THE RELATED ART

In general, a circuitry is often composed by a multilevel interconnection structure in a semiconductor device in response to a request for recent enhanced density and enhanced integration. In this case, a technique for filling a contact hole, which is a connection part between a lower-layer device and an upper-layer aluminum wiring, and a via hole, which is a connection part between a lower-layer aluminum wiring and an upper-layer aluminum wiring, is important to provide an electrical connection therebetween.

Sputter aluminum and CVD tungsten are generally used as the technique to fill the contact hole, the via hole and the like. Recently, there is a tendency that the CVD tungsten is mainly used because of a higher filling performance thereof.

However, when a tungsten film is formed directly onto a silicon layer or an aluminum wiring which is a lower layer, a diffusion layer formed in the silicon layer is destroyed by an attack of fluorine and/or an adhesiveness to the tungsten film which is an upper layer becomes worse, at a boundary portion therebetween. This is not preferable for the current semiconductor device, to which an electric-power saving and a high-speed operation are required.

Moreover, when tungsten is used for the filling, $WF_6$ gas which is one of process gases used in this process breaks into the Si substrate side so as to deteriorate electric properties and the like. This tendency is not preferable.

Consequently, in order to prevent the above phenomenon, before filling a contact hole, a through hole and the like with the tungsten, a barrier metal layer is thinly formed all over the surface of a wafer including a surface inside the hole. A double-layer structure of Ti/TiN (titanium nitride) or a single-layer structure of TiN is generally used as a material of this barrier metal layer. Regarding prior arts, there are Japanese Patent Laid-open Publication (Kokai) No. Hei-6-89873, Japanese Patent Laid-Open Publication (Kokai) No. Hei-10-106974, "Decomposition Property of Methylhydrazine with Titanium Nitridation at Low Temperature" (P. 934-938, J. Electrochem. Soc., Vol. 142 no. 3, March 1995), and so on.

For example, a case of forming only a TiN film is explained. As a film-forming gas, for example, a $TiCl_4$ gas and a $NH_3$ gas are used. These gases are introduced continuously and synchronously for a predetermined time into a processing container in which a vacuum has been created. Then, a TiN film is deposited on a surface of a wafer by means of a thermal CVD (Chemical Vapor Deposition) at a predetermined process temperature. After the TiN film is formed, into the same processing container, only the $NH_3$ gas is introduced for a predetermined time without introducing the $TiCl_4$ gas (which is called "post flow of $NH_3$ gas"). Thus, Cl elements remaining in the TiN film are removed. The reason of conducting the post-flow step is that if any Cl element remains in the film, resistivity of the film may increase and/or corrosion thereof may occur.

Herein, because of enhanced miniaturization and integration in a semiconductor integration circuit, line-width is smaller and film-thickness is thinner. Thus, the process temperature, at which the TiN film is formed, is preferably set at a temperature as low as possible, in order not to cause thermal damage to various kinds of films under the TiN film. Thus, although the TiN film was conventionally formed at a relatively high temperature such as about 560° C., it is recently formed at a relatively low temperature such as about 450° C.

If the TiN film is formed at the above high temperature, by conducting the post flow of the $NH_3$ gas, the Cl elements remaining in the film can be satisfactorily removed, that is, the portion can be nitrided. However, if the TiN film is formed at the above low temperature, density of Cl elements remaining in the film becomes higher. Then, even if the post flow of the $NH_3$ gas is conducted, the portion corresponding to removed Cl elements may not be replaced (filled) with nitrogen elements satisfactorily, that is, voids may be generated in atomic level. Because of the voids, the composition of the film may be rough, so that cracks may be easily generated in the film. Alternatively, if the wafer is exposed to atmosphere, the voids may be filled with oxygen in the atmosphere or moisture, which may increase the resistivity (specific resistance) of the film itself.

In addition, if the TiN film is formed at the above low temperature, powder-like compounds such as $TiNCl_x$ may be generated so that the film may abnormally grow.

SUMMARY OF THE INVENTION

This invention is developed by focusing the aforementioned problems in order to resolve them effectively. An object of the present invention is to provide a film-forming method of a metal-nitride film which has a low chlorine density and a low resistivity, wherein cracks and abnormal growth of the film may be prevented.

The present invention is a film-forming method of forming a metal-nitride film onto a surface of an object to be processed in a processing container in which a vacuum can be created, the film-forming method comprising: a step of continuously supplying an inert gas into a processing container set at a low film-forming temperature; a step of intermittently supplying a metal-source gas into the processing container, during the step of continuously supplying the inert gas; a step of supplying a nitrogen-including reduction gas into the processing container at the same time that the metal-source gas is supplied, during a supply term of the metal-source gas, during the step of intermittently supplying the metal-source gas; and a step of supplying the nitrogen-including reduction gas into the processing container for a term shorter than a non-supply term of the metal-source gas, during the non-supply term of the metal-source gas, during the step of intermittently supplying the metal-source gas.

According to the above feature, a metal-nitride film which has a low chlorine density, a low resistivity, less crack generation and no abnormal growth can be deposited.

Specifically, the low film-forming temperature is 150° C. to 450° C. In view of throughput, it is preferably 200° C. to 450° C., in particular 350° C. to 450° C.

Preferably, during the step of supplying the nitrogen-including reduction gas into the processing container for a term shorter than a non-supply term of the metal-source gas, during the non-supply term of the metal-source gas, a second nitrogen-including reduction gas, whose reducing power is greater than that of the nitrogen-including reduction gas, is adapted to be supplied at the same time that the nitrogen-including reduction gas is supplied.

Alternatively, during the step of supplying the nitrogen-including reduction gas into the processing container for a term shorter than a non-supply term of the metal-source gas, during the non-supply term of the metal-source gas, a plasma-assist gas is adapted to be supplied at the same time that the nitrogen-including reduction gas is supplied, so as to generate plasma. In the case, more preferably, a reduction gas is adapted to be supplied at the same time that the plasma-assist gas is supplied.

In addition, the present invention is a film-forming method of forming a metal-nitride film onto a surface of an object to be processed in a processing container in which a vacuum can be created, the film-forming method comprising: a step of continuously supplying an inert gas and a nitrogen-including reduction gas into a processing container set at a low film-forming temperature; and a step of intermittently supplying a metal-source gas into the processing container, during the step of continuously supplying the inert gas and the nitrogen-including reduction gas.

According to the above feature as well, a metal-nitride film which has a low chlorine density, a low resistivity, less crack generation and no abnormal growth can be deposited.

In the case as well, specifically, the low film-forming temperature is 150° C. to 450° C. In view of throughput, it is preferably 200° C. to 450° C., in particular 350° C. to 450° C.

Preferably, a second nitrogen-including reduction gas, whose reducing power is greater than that of the nitrogen-including reduction gas, is adapted to be supplied into the processing container for a term shorter than a non-supply term of the metal-source gas, during the non-supply term of the metal-source gas, during the step of intermittently supplying the metal-source gas.

Alternatively, a plasma-assist gas is adapted to be supplied into the processing container for a term shorter than a non-supply term of the metal-source gas, during the non-supply term of the metal-source gas, during the step of intermittently supplying the metal-source gas, so as to generate plasma. In the case, more preferably, a reduction gas is adapted to be supplied at the same time that the plasma-assist gas is supplied.

In addition, the present invention is a film-forming method of forming a metal-nitride film onto a surface of an object to be processed in a processing container in which a vacuum can be created, the film-forming method comprising: a step of continuously supplying an inert gas into a processing container set at a low film-forming temperature; a step of intermittently supplying a metal-source gas into the processing container, during the step of continuously supplying the inert gas; a step of supplying a nitrogen-including reduction gas into the processing container for a term shorter than a supply term of the metal-source gas, during the supply term of the metal-source gas, during the step of intermittently supplying the metal-source gas; and a step of supplying the nitrogen-including reduction gas into the processing container for a term shorter than a non-supply term of the metal-source gas, during the non-supply term of the metal-source gas, during the step of intermittently supplying the metal-source gas.

According to the above feature as well, a metal-nitride film which has a low chlorine density, a low resistivity, less crack generation and no abnormal growth can be deposited.

In the case as well, specifically, the low film-forming temperature is 150° C. to 450° C. In view of throughput, it is preferably 200° C. to 450° C., in particular 350° C. to 450° C.

Preferably, during the step of supplying the nitrogen-including reduction gas into the processing container for a term shorter than a non-supply term of the metal-source gas, during the non-supply term of the metal-source gas, a second nitrogen-including reduction gas, whose reducing power is greater than that of the nitrogen-including reduction gas, is adapted to be supplied at the same time that the nitrogen-including reduction gas is supplied.

Alternatively, preferably, during the step of supplying a nitrogen-including reduction gas into the processing container for a term shorter than a non-supply term of the metal-source gas, during the non-supply term of the metal-source gas, a plasma-assist gas is adapted to be supplied at the same time that the nitrogen-including reduction gas is supplied, so as to generate plasma. In the case, more preferably, a reduction gas is adapted to be supplied at the same time that the plasma-assist gas is supplied.

In addition, the present invention is a film-forming method of forming a metal-nitride film onto a surface of an object to be processed in a processing container in which a vacuum can be created, the film-forming method comprising: a step of continuously supplying an inert gas into a processing container set at a low film-forming temperature; a step of intermittently supplying a metal-source gas into the processing container, during the step of continuously supplying the inert gas; a step of supplying a nitrogen-including reduction gas into the processing container at the same time that the metal-source gas is supplied, during a supply term of the metal-source gas, during the step of intermittently supplying the metal-source gas; and a step of supplying a second nitrogen-including reduction gas, whose reducing power is greater than that of the nitrogen-including reduction gas, into the processing container for a term shorter than a non-supply term of the metal-source gas, during the non-supply term of the metal-source gas, during the step of intermittently supplying the metal-source gas.

According to the above feature as well, a metal-nitride film which has a low chlorine density, a low resistivity, less crack generation and no abnormal growth can be deposited.

In the case as well, specifically, the low film-forming temperature is 150° C. to 450° C. In view of throughput, it is preferably 200° C. to 450° C., in particular 350° C. to 450° C.

In addition, the present invention is a film-forming method of forming a metal-nitride film onto a surface of an object to be processed in a processing container in which a vacuum can be created, the film-forming method comprising: a step of continuously supplying an inert gas into a processing container set at a low film-forming temperature; a step of intermittently supplying a metal-source gas into the processing container, during the step of continuously supplying the inert gas; a step of supplying a nitrogen-including reduction gas into the processing container at the same time that the metal-source gas is supplied, during a supply term of the metal-source gas, during the step of intermittently supplying the metal-source gas; and a step of supplying a plasma-assist gas into the processing container for a term shorter than a non-supply term of the metal-source gas and continuous to the next supply term of the metal-source gas, during the non-supply term of the metal-source gas, during the step of intermittently supplying the metal-source gas, so as to generate plasma.

According to the above feature as well, a metal-nitride film which has a low chlorine density, a low resistivity, less crack generation and no abnormal growth can be deposited.

In the case as well, specifically, the low film-forming temperature is 150° C. to 450° C. In view of throughput, it is preferably 200° C. to 450° C., in particular 350° C. to 450° C.

Preferably, a reduction gas is adapted to be supplied at the same time that the plasma-assist gas is supplied.

In addition, the metal-source gas is for example $TiCl_4$ gas, and the nitrogen-including reduction gas is for example $NH_3$ gas.

In addition, the inert gas is for example $N_2$ gas. Alternatively, the inert gas is for example Ar gas.

The second nitrogen-including reduction gas is for example any of hydrazine, monomethylhydrazine and dimethylhydrazine.

BRIEF DESCRIPTION OF THE DRAWINGS

FIG. 5 is a graph showing a relationship between numbers of cycles of gas-supply and stresses of TiN films;

FIG. 6 is photographs showing cross sections of TiN films taken by a scanning electron microscope;

FIG. 13 is a chart showing timings of supply of various gases in a first variant of the third embodiment;

FIG. 14 is a chart showing timings of supply of various gases and timings of generation of plasma, in a second variant of the third embodiment;

FIG. 16 is a chart showing timings of supply of various gases and timings of generation of plasma, in a fifth embodiment according to the present invention.

DESCRIPTION OF THE PREFERRED EMBODIMENT

Hereinafter, embodiments of a film-forming method according to the present invention will be described in detail based on the attached drawings.

Figure 1:
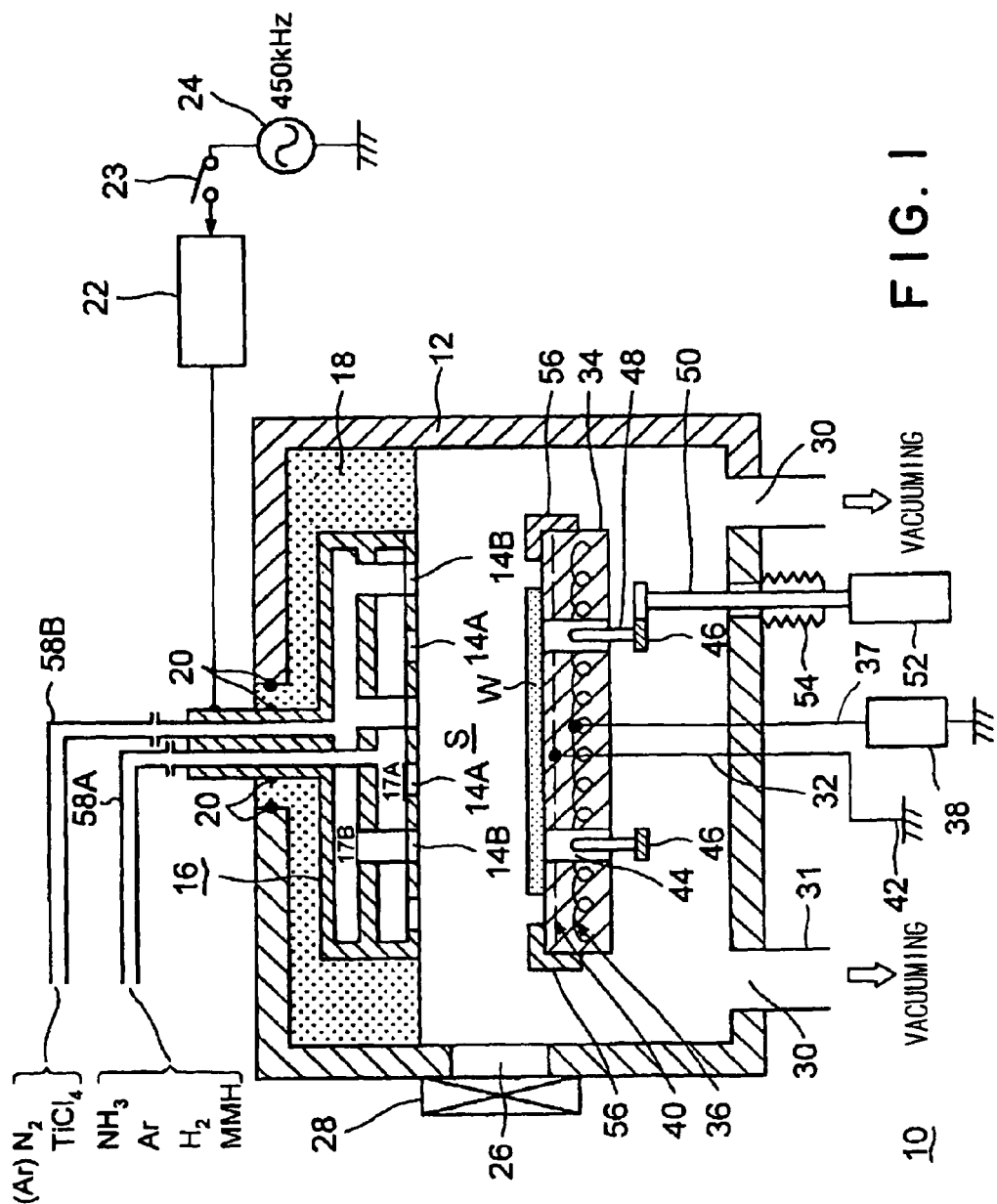
FIG. 1 is a schematic cross sectional view showing an example of processing unit for carrying out a film-forming method according to the present invention.
Figure 2:
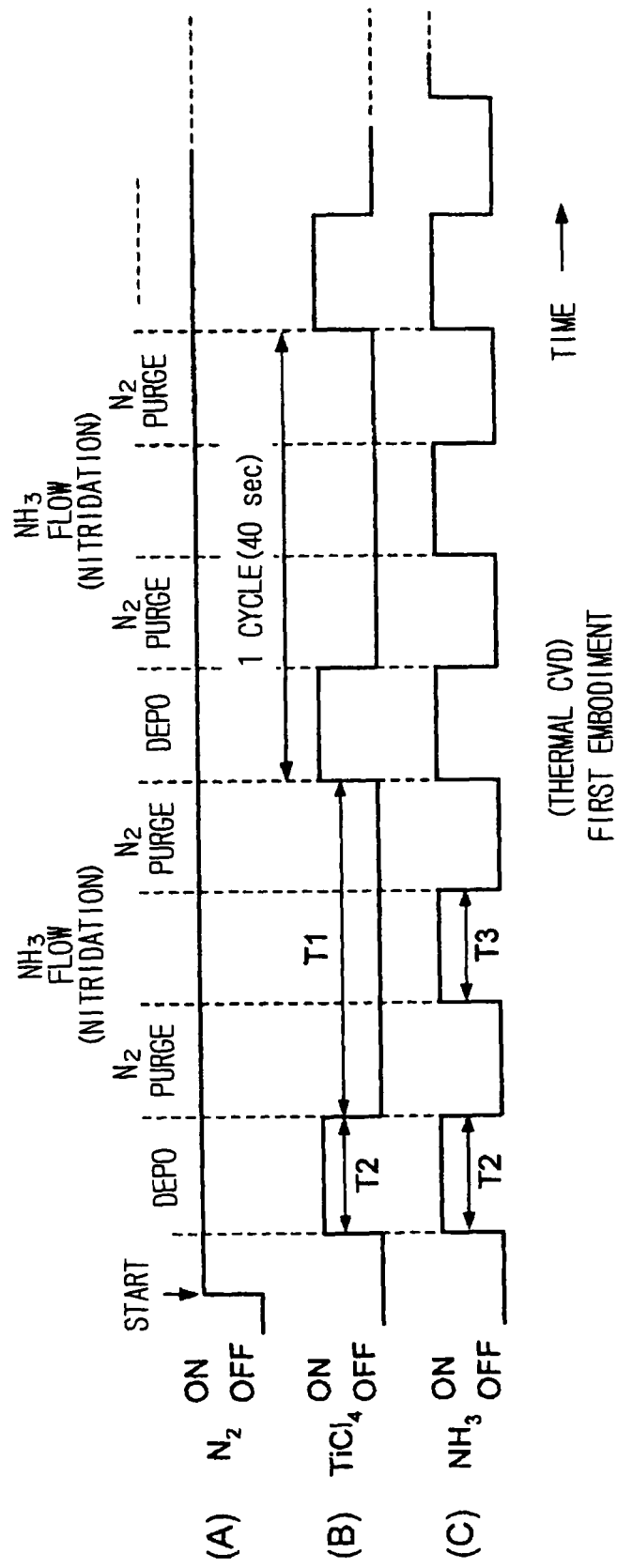
FIG. 2 is a chart showing timings of supply of various gases in a first embodiment according to the present invention.

FIG. 1 is a schematic cross sectional view showing an example of processing unit for carrying out a film-forming method according to the present invention, and FIG. 2 is a chart showing timings of supply of various gases in a first embodiment according to the present invention. Herein, a case is explained as an example, wherein the processing unit is a plasma CVD film-forming unit and the metal-nitride film is a TiN film.

As shown in FIG. 1, the plasma CVD film-forming unit 10 as a processing unit has a processing container 12 formed cylindrically and made of, for example, nickel or a nickel alloy. A ceiling part of the processing container 12 is provided with a showerhead 16, which has a large number of gas-jetting holes (ways) 14A, 14B in a lower surface thereof. Thus, a process gas such as a film-forming gas or the like can be introduced into a processing space S in the processing container 12. For example two gas spaces 17A, 17B are separately defined in the showerhead 16. The gas jetting holes 14A, 14B are respectively communicated with the gas spaces 17A, 17B. Thus, the two gases are adapted to be first mixed in the processing space S. This manner of supplying the gases is called "post mix".

The whole showerhead 16 is made of an electric conductor such as nickel or a nickel alloy and thus serves as an upper electrode. An outside peripheral surface and an upper surface of the showerhead 16, which serves as the upper electrode, are entirely covered with an insulating member 18 such as quartz or alumina ($Al_2O_3$). The showerhead 16 is fixed to the processing container 12 with an insulation state via the insulating member 18. In the case, sealing members 20 such as O-rings or the like are respectively interposed at connecting parts between the showerhead 16, the insulating member 18 and the processing container 12. Thus, airtightness in the processing container 12 can be maintained.

Then, a high-frequency electric power source 24 that generates a high-frequency electric voltage of for example 450 kHz is connected to the showerhead 16 via a matching circuit 22 and a open-close switch 23. Thus, when necessary, the high-frequency electric voltage is applied to the showerhead 16, which is the upper electrode. The frequency of the high-frequency electric voltage is not limited to 450 kHz, but could be for example 13.56 MHz or the like.

In addition, a port 26, through which a wafer is conveyed, is formed at a lateral wall of the processing container 12. A gate valve 28 that can be opened and closed is provided at the port 26. A load-lock chamber or a transfer chamber or the like, not shown, can be communicated with the gate valve 28.

An exhausting port 30 is provided at a bottom of the processing container 12. An exhausting pipe 31 is connected to the exhausting port 30, a vacuum pump or the like, not shown, being provided on the way of the exhausting pipe 31. Thus, when necessary, a vacuum can be created in the processing container 12. In the processing container 12, a stage 34, onto which a semiconductor wafer W as an object to be processed is placed, is provided via a column 32 from the bottom. The stage 34 serves as a lower electrode. Then, plasma can be generated by means of the high-frequency electric voltage in the processing space S between the stage 34 as the lower electrode and the showerhead 16 as the upper electrode.

Specifically, the whole stage 34 is made of a ceramics such as AlN. A heater 36, which consists of for example a resistive element such as a molybdenum wire, is buried in the stage 34 in a predetermined pattern. A heater electric power source 38 is connected to the heater 36 via a wiring 37. Thus, if necessary, electric power can be supplied to the heater 36. In addition, an electrode body 40, which is for example a mesh of molybdenum wire, is buried in the stage 34 above the heater 36, so as to spread out in the whole in-plane (radial) directions of the stage 34. The electrode body 40 is grounded via a wiring 42. Herein, a high-frequency electric voltage as a bias voltage can be applied to the electrode body 40.

A plurality of pin-holes 44 that extend through vertically are formed in the stage 34. A pushing-up pin 48 made of for example quartz, whose lower end is commonly connected to a connecting ring 46, is inserted in each pin-hole 44 in a freely movable manner. The connecting ring 46 is connected to an upper end of a protrudable rod 50, which extends through the bottom of the processing container in a vertically movable manner. The lower end of the protrudable rod 50 is connected to an air cylinder 52. Thus, each pushing-up pin 48 can protrude upward from an upper end of each pin-hole 44 and subside downward, when the wafer W is conveyed thereto or therefrom. An extendable bellows 54 is provided for a penetration part of the bottom of the processing container by the protrudable rod 50. Thus, the protrudable rod 50 can be vertically moved while maintaining the airtightness in the processing container 12.

A focus ring 56 is provided at a peripheral portion of the stage 34 as the lower electrode so as to concentrate the plasma into the processing space S. The gas pipes 58A, 58B are connected to the ceiling part of the showerhead 16 so as to communicate with the gas spaces 17A, 17B, respectively.

An $N_2$ gas or an Ar gas as an inert gas and/or a $TiCl_4$ gas as a metal source gas is adapted to be supplied through the gas pipe 58B together with a carrier gas (for example, $N_2$ gas). On the other hand, an $NH_3$ gas as a nitrogen-including reduction gas, an Ar gas as a plasma assist gas, an $H_2$ gas as a reduction gas and/or an MMH (monomethylhydrazine) gas as a second nitrogen-including reduction gas whose reducing power is greater than that of the $NH_3$ gas are adapted to be supplied through the gas pipe 58A.

Herein, in the above description, all the gases used in below explained embodiments are referred to. However, all the gases are not used for one film-forming process, but only necessary gases are supplied depending on the respective embodiments. Thus, it is natural that each gas can be supplied and stopped supplying independently and selectively if necessary. In addition, control of flow rate for each gas can be also carried out independently.

Herein, the high-frequency electric power source 24 for generating the plasma is provided, but a film-forming process can be also carried out by means of a mere thermal CVD without using plasma. Such a film-forming process by means of a thermal CVD can be carried out by a film-forming unit with for example a heating lamp.

Then, with reference to FIG. 2, the first embodiment of the film-forming method is explained.

Herein, without using plasma, a TiN film is deposited by means of a thermal CVD. In the first embodiment, an $N_2$ gas (see FIG. 2(A)) is used as an inert gas, a $TiCl_4$ gas (see FIG. 2(B)) is used as a metal source gas, and an $NH_3$ gas (see FIG. 2(C)) is used as a nitrogen-including reduction gas. The above gases are supplied in accordance with pulse-patterns in time, as shown in FIG. 2. That is, the $N_2$ gas as the inert gas is continuously supplied, while the $TiCl_4$ gas as the metal source gas is intermittently supplied, and the $NH_3$ gas as the nitrogen-including reduction gas is supplied at the same time that the metal source gas is supplied and also during non-supply terms of the source gas for shorter terms than the non-supply terms.

Here, "ON" in FIG. 2 designates a gas supply state, while "OFF" designates a gas non-supply state. This is the same for other drawings showing timings of supply of the gases.

As shown in FIG. 2, in a state wherein a vacuum is created in the processing container 12, the $N_2$ gas is continuously supplied, the $TiCl_4$ gas is intermittently supplied, and the $NH_3$ gas is supplied at the same time that the $TiCl_4$ gas is supplied and also during non-supply terms T1 of the $TiCl_4$ gas for terms shorter than the non-supply terms T1. Thus, a step cycle of DEPO (deposition of TiN film)→$N_2$ PURGE→$NH_3$ FLOW (nitridation of TiN film (reduction of chlorine))→$N_2$ PURGE (→DEPO→$N_2$ PURGE→$NH_3$ FLOW→) . . . is repeated the number of times in accordance with the necessity. At the DEPO step, the TiN film is deposited. At the $NH_3$ FLOW step, chlorine remaining in the TiN film is moved away so that the portion is nitrided (reduction of the chlorine is carried out).

Herein, a term from a timing at which the $TiCl_4$ gas starts to be supplied to the next timing at which the $TiCl_4$ gas starts to be supplied is defined as one cycle. In the present embodiment, the term of the cycle is about 40 seconds. Of course, the term of the cycle is not limited thereto, but could be for example in a range of 10 to 60 seconds.

In addition, a supply term T2 for which the $TiCl_4$ gas and the $NH_3$ gas are synchronously supplied is about 10 seconds, and a term T3 for which the $NH_3$ gas is solely supplied is about 10 seconds. The term T3 is set at a substantially center of the non-supply term T1 of the $TiCl_4$ gas.

A process temperature (low film-forming temperature) is a temperature lower than 580° C., which is a conventional film-forming temperature, for example 450° C. In detail, the process temperature (low film-forming temperature) may be a temperature of 150° C. to 450° C. In view of throughput, it is preferably 200° C. to 450° C., in particular 350° C. to 450° C.

With respect to gas flow rates, about 500 sccm is for the $N_2$ gas, about 30 scam is for the $TiCl_4$ gas, and about 30 sccm is for the $NH_3$ gas.

Thus, it is possible to lower chlorine density that may be contained in the TiN film, even at a relatively low process temperature, by intermittently depositing a plurality of very thin films in sequence by intermittently supplying the film-forming gas. In addition, the TiN film can have a low resistivity, less cracks may occur in the TiN film, and abnormal growth of the TiN film may be also inhibited:

In particular, in the first embodiment, as shown in FIG. 2, there are $N_2$ PURGE steps before and after the DEPO step. Thus, the $TiCl_4$ gas and the $NH_3$ gas, which are gases contributing to the film-forming, are completely removed. Thus, step coverage at step portions may be improved, and overhang of the TiN film at through holes, contact holes or via holes may be prevented.

Figure 3:
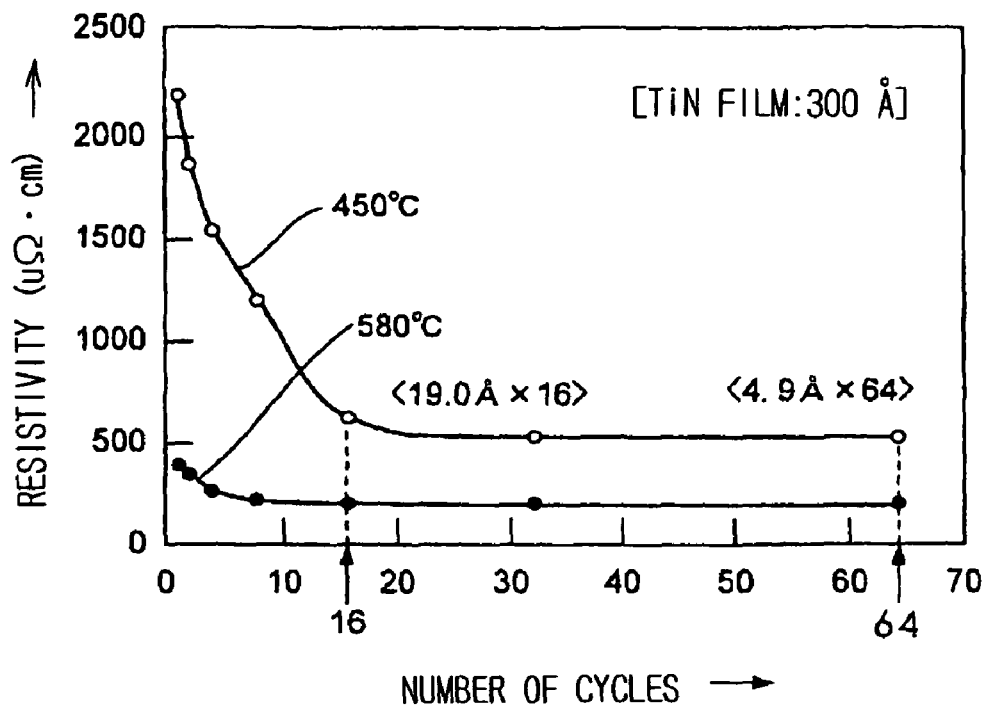
FIG. 3 is a graph showing a relationship between numbers of cycles of gas-supply and resistivities of TiN films.
Figure 4:
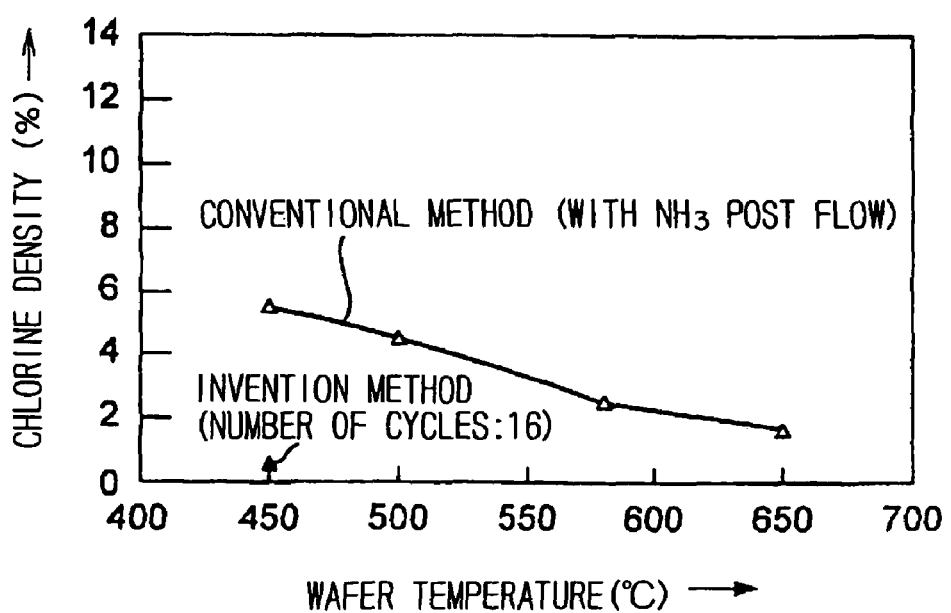
FIG. 4 is a graph showing a relationship between wafer temperatures and chlorine densities in TiN films.

Next, a result of the first embodiment is explained compared with a result of a conventional film-forming method. FIG. 3 is a graph showing a relationship between numbers of cycles of gas-supply and resistivities of TiN films. FIG. 4 is a graph showing a relationship between wafer temperatures and chlorine densities in TiN films. FIG. 5 is a graph showing a relationship between numbers of cycles of gas-supply and stresses of TiN films. FIG. 6 is photographs showing cross sections of TiN films taken by a scanning electron microscope.

At first, FIG. 3 shows dependence of resistivity of the TiN film on the number of cycles of gas-supply, when average total thickness of the formed TiN film is about 300 Å. Herein, for example, if a film having a thickness of 300 Å is deposited by the number of cycles of "five", the respective gas flow rates are controlled so that a film having a thickness of about 60 Å is deposited per one cycle.

As seen clearly from FIG. 3, if the process temperature is 580° C., both when a thickness of 300 Å is formed by one cycle and when a thickness of 300 Å is formed by sixty cycles or so, resistivities of the films are not so different, and they are both low. On the other hand, if the process temperature is 450° C. according to the present invention, when the number of cycles is small, resistivity is high and thus not preferable. However, if the number of cycles is increased, the resistivity is rapidly reduced. Then, when the number of cycles is about sixteen (≈growth of 19.0 Å/one cycle), the resistivity becomes about 600 μΩ·cm, and is substantially saturated (not reduced any more) even when the number of cycles is increased more.

In addition, if the film-forming thickness per one cycle is thinner, for example about 9.5 Å, the film-forming process can be carried out even at a process temperature of 200° C. to 350° C. If the film-forming thickness per one cycle is further thinner, the film-forming process can be carried out even at a process temperature of about 150° C.

The resistivity of about 600 μΩ·cm is a little higher than that at the conventional film-forming temperature, but within an allowable range. Thus, when the TiN film is formed, it has been found that at least sixteen is preferably set as the number of cycles.

In addition, FIG. 4 shows dependence of chlorine density in the TiN film on wafer temperatures. As seen clearly from FIG. 4, in a conventional case which has a post-flow of the $NH_3$ gas and whose number of cycles is one, when the process temperature is lower, chlorine density is higher. However, in a case according to the present invention whose process temperature is 450° C. and whose number of cycles is sixteen, although the process temperature is low, chlorine density was very low, about 0.5%. That value is further lower than about 1.5%, which is chlorine density in a conventional case wherein the process temperature is 650° C. That is, with respect to the chlorine density, it has been found that the present invention can achieve a very good result.

In addition, FIG. 5 shows dependence of stress in the TiN film on the number of cycles of gas-supply. In the case as well, total thickness of the TiN film is set to 300 Å. As seen clearly from FIG. 5, stress is substantially zero in a conventional case wherein the number of cycles is one, and the stress is rapidly increased as the number of cycles is increased. In addition, when the number of cycles is sixteen, the increase of the stress is substantially ended (saturated). The state wherein the stress is substantially zero is a state wherein cracks occur to release the stress, that is, not preferable. The state wherein the number of cycles is sixteen or more and thus the stress is saturated is a state wherein few cracks occur in the TiN film, that is, a good state. Thus, in view of the stress in the TiN film as well, it has been found that at least sixteen is preferably set as the number of cycles.

In addition, FIG. 6 is photographs showing cross sections of TiN films taken by a scanning electron microscope. In a case of the conventional method (the number of cycles is one) shown in FIG. 6(A), granular crystals are found in the TiN film, that is, it is found that the TiN film grows abnormally. On the other hand, in a case of the present invention shown in FIG. 6(B), granular crystals are not found in the TiN film, that is, it is found that the TiN film grows normally. Herein, the number of cycles of gas-supply for forming the TiN film in FIG. 6(B) was forty.

Next, a first variant of the first embodiment is explained.

Figure 7:
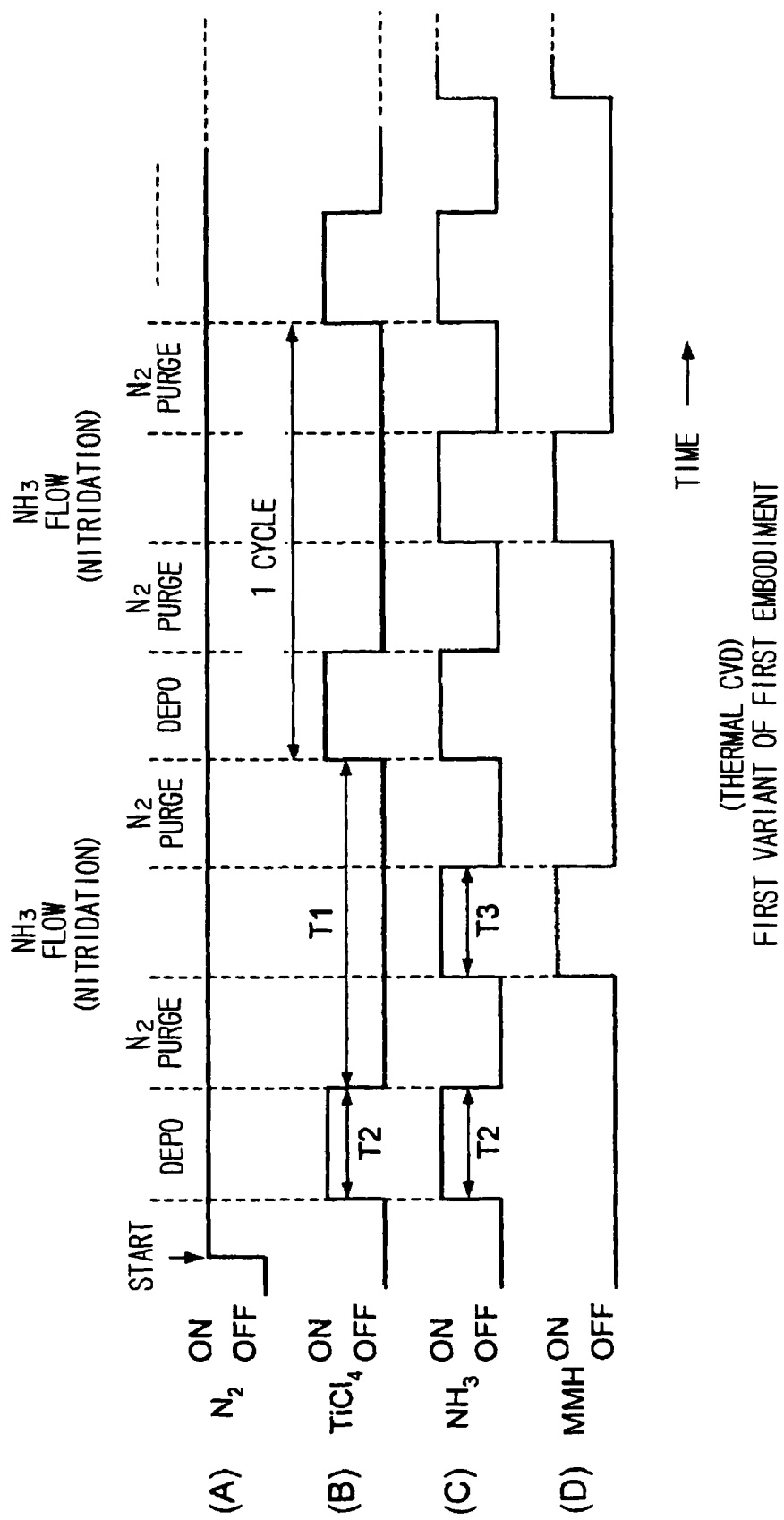
FIG. 7 is a chart showing timings of supply of various gases in a first variant of the first embodiment.

FIG. 7 is a chart showing timings of supply of various gases in the first variant of the first embodiment. The explanation of the same gases as in FIG. 2 is omitted.

The feature of the variant is that a TiN film is deposited by a thermal CVD by supplying a second nitrogen-including reduction gas, for example a monomethylhydrazine (MMH) gas (see FIG. 7(D)), in addition to the gas supplying manner of the first embodiment.

That is, during the non-supply terms T1 of the $TiCl_4$ gas as the metal source gas, at the same time that the $NH_3$ gas as the nitrogen-including reduction gas is supplied, the MMH gas as the second nitrogen-including reduction gas whose reducing power is greater than that of the nitrogen-including reduction gas is adapted to be supplied.

By using a gas whose reducing power is greater than that of the $NH_3$ gas, like the MMH gas, as the second nitrogen-including reduction gas, nitiriding power can be improved when the gas is supplied. Thus, the chlorine density can be more reduced, so that a more complete TiN film can be formed.

Next, a second variant of the first embodiment is explained.

Figure 8:
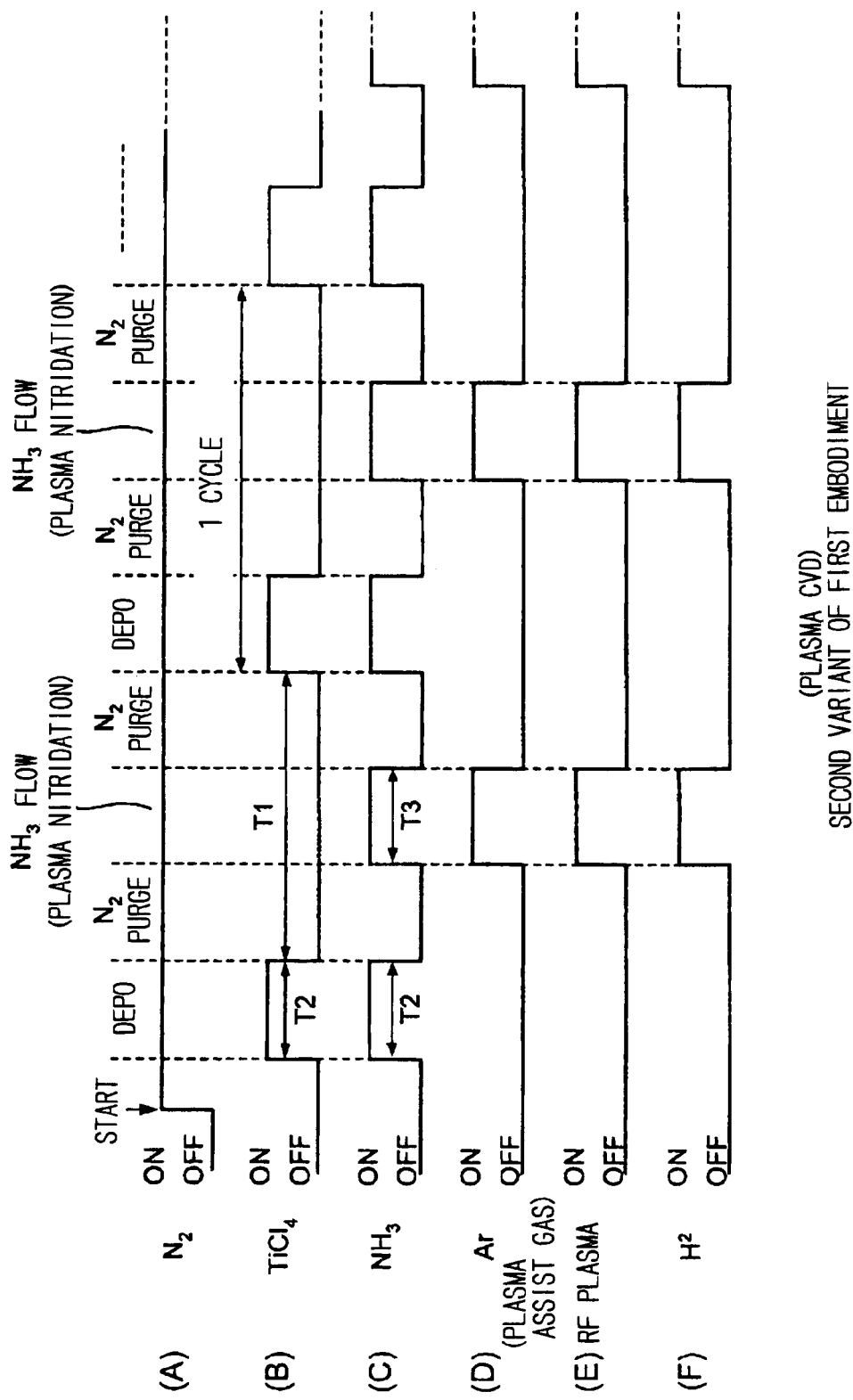
FIG. 8 is a chart showing timings of supply of various gases and timings of generation of plasma, in a second variant of the first embodiment.

FIG. 8 is a chart showing timings of supply of various gases and timings of generation of plasma, in the second variant of the first embodiment. The explanation of the same gases as in FIG. 2 is omitted.

The feature of the variant is that a TiN film is deposited by a plasma CVD: by adding a plasma assist gas, for example an Ar gas (see FIG. 8(D)), so as to generate plasma; and at that time by adding a reduction gas, for example an $H_2$ gas (see FIG. 8(F)), if necessary; in addition to the gas supplying manner of the first embodiment.

That is, during the non-supply terms T1 of the $TiCl_4$ gas as the metal source gas, at the same time that the $NH_3$ gas as the nitrogen-including reduction gas is supplied, the Ar gas as the plasma assist gas is supplied so as to generate the plasma. In the case, the Ar gas is supplied only while the $NH_3$ FLOW is conducted, and a high-frequency electric voltage is applied to the upper electrode 16 so as to generate the plasma. Thus, nitriding power to the TiN film is further enhanced, and thus a more complete TiN film whose chlorine density is smaller can be formed. The high-frequency electric voltage can be applied to both the upper electrode 16 and the lower electrode 40.

In addition, when the plasma is generated, as shown in FIG. 8(F), the $H_2$ gas as the reduction gas can be supplied so as to improve the nitriding power further more.

Next, a second embodiment of the present invention is explained.

Figure 9:
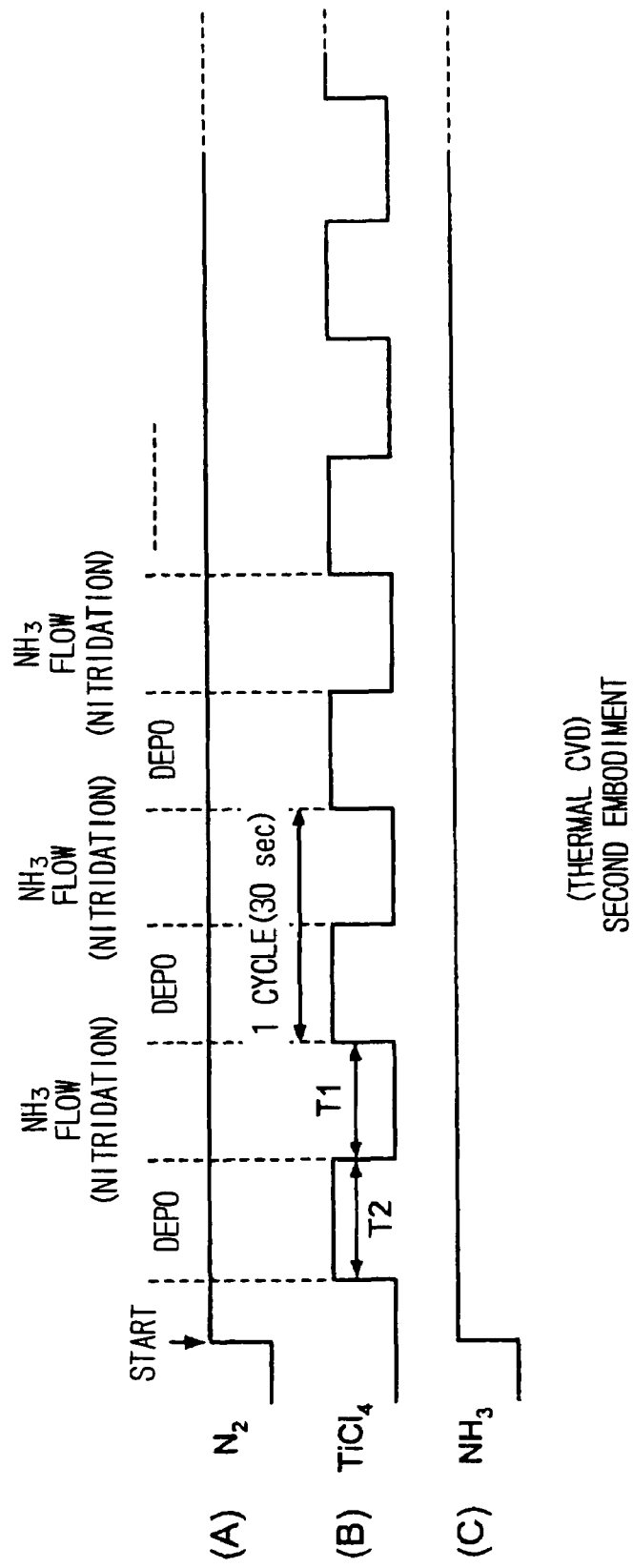
FIG. 9 is a chart showing timings of supply of various gases in a second embodiment according to the present invention.

FIG. 9 is a chart showing timings of supply of various gases in the second embodiment according to the present invention.

Herein, an inert gas and a nitrogen-including reduction gas are continuously supplied, while a metal source gas is intermittently supplied. That is, an $N_2$ gas as the inert gas and an $NH_3$ gas as the nitrogen-including reduction gas are continuously supplied, while a $TiCl_4$ gas as the metal source gas is intermittently supplied in accordance with a pulse-pattern in time. Thus, a TiN film is deposited by a thermal CVD. Then, a step cycle of DEPO→$NH_3$ FLOW (nitridation) (→DEPO→$NH_3$ FLOW (nitridation)) is repeated in sequence. In the case shown in FIG. 9, a supply term T2 and a non-supply term T1 of the $TiCl_4$ gas are set to substantially the same term. In addition, the term of the cycle is about 30 seconds.

In the second embodiment as well, it is possible to lower chlorine density that may be contained in the TiN film, even at a relatively low process temperature, by intermittently depositing a plurality of very thin films in sequence by intermittently supplying the film-forming gas. In addition, the TiN film can have a low resistivity, less cracks may occur in the TiN film, and abnormal growth of the TiN film may be also inhibited.

In addition, in the case of the second embodiment, the DEPO step for supplying the $TiCl_4$ gas and the nitriding step of the $NH_3$ FLOW are continuous (adjacent), that is, there is no $N_2$ PURGE step, differently from the first embodiment shown in FIG. 2. Thus, when the supply of the $TiCl_4$ gas is started and stopped, a state may be temporarily generated wherein density (partial pressure) of the $TiCl_4$ gas is extremely smaller than density (partial pressure) of the $NH_3$ gas, which is continuously supplied. This may act to deteriorate step coverage slightly. However, in the second embodiment, since the $N_2$ PURGE step is omitted, throughput may be enhanced.

Next, a first variant of the second embodiment is explained.

Figure 10:
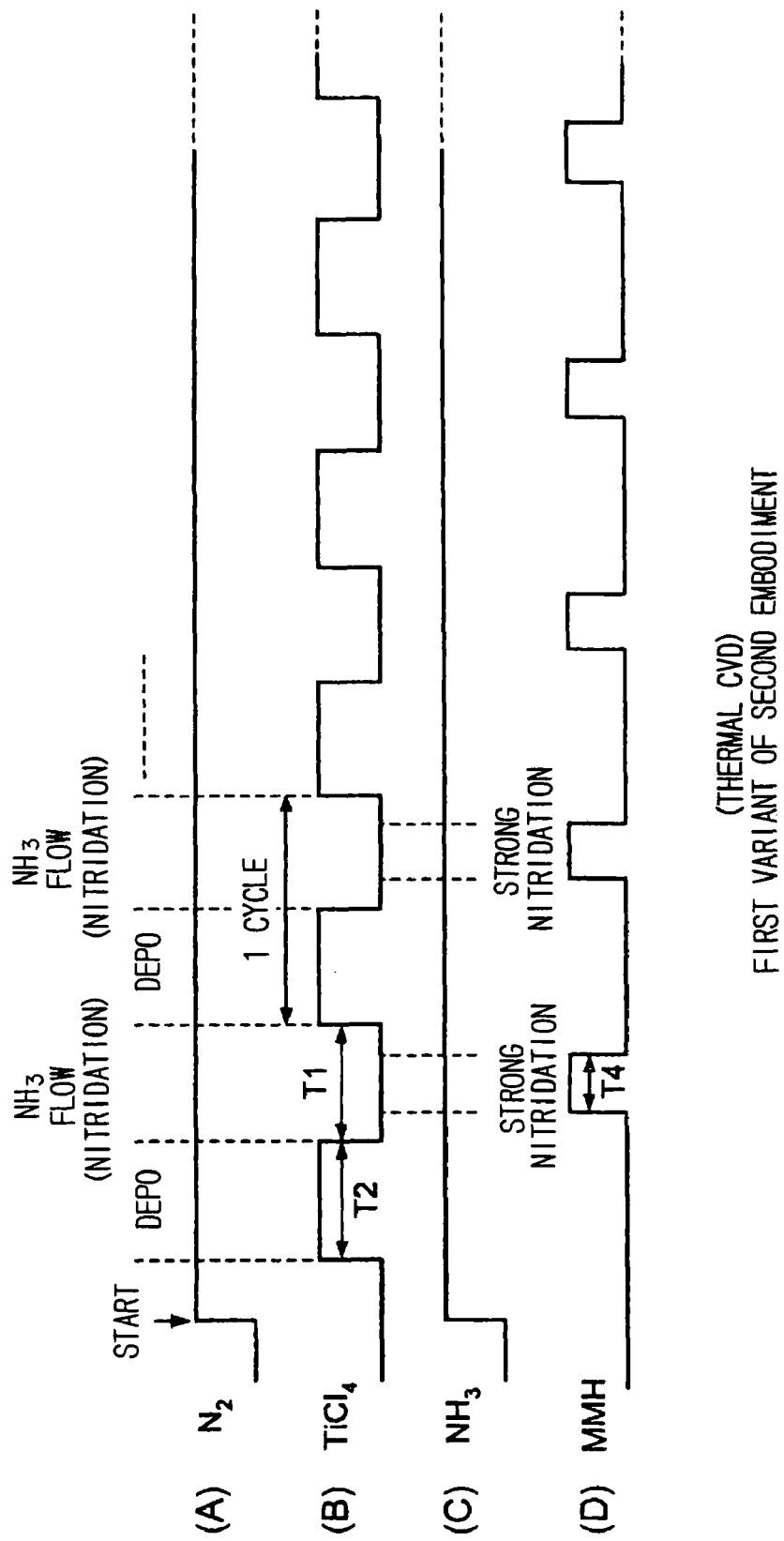
FIG. 10 is a chart showing timings of supply of various gases in a first variant of the second embodiment.

FIG. 10 is a chart showing timings of supply of various gases in the first variant of the second embodiment. The explanation of the same gases as in FIG. 9 is omitted.

The feature of the variant is that a TiN film is deposited by a thermal CVD by supplying a second nitrogen-including reduction gas, for example a monomethylhydrazine gas (see FIG. 10(D)), in addition to the gas supplying manner of the second embodiment.

That is, during the non-supply terms T1 of the $TiCl_4$ gas as the metal source gas, for terms T4 shorter than the non-supply terms T1, the MMH gas as the second nitrogen-including reduction gas, whose reducing power is greater than that of the $NH_3$ gas as the nitrogen-including reduction gas, is adapted to be supplied.

By using a gas whose reducing power is greater than that of the $NH_3$ gas, like the MMH gas, as the second nitrogen-including reduction gas, nitiriding power can be improved when the gas is supplied. Thus, the chlorine density can be more reduced, so that a more complete TiN film can be formed.

In addition, herein, the supply term T4 of the MMH gas is set at substantially the center of the non-supply term T1 of the $TiCl_4$ gas. In addition, the supply timing of the $TiCl_4$ gas and the supply timing of the MMH gas are different from each other so that both the gases are not supplied at the same time. Thus, nitriding power may not be too great, and step coverage may not be deteriorated.

Next, a second variant of the second embodiment is explained.

Figure 11:
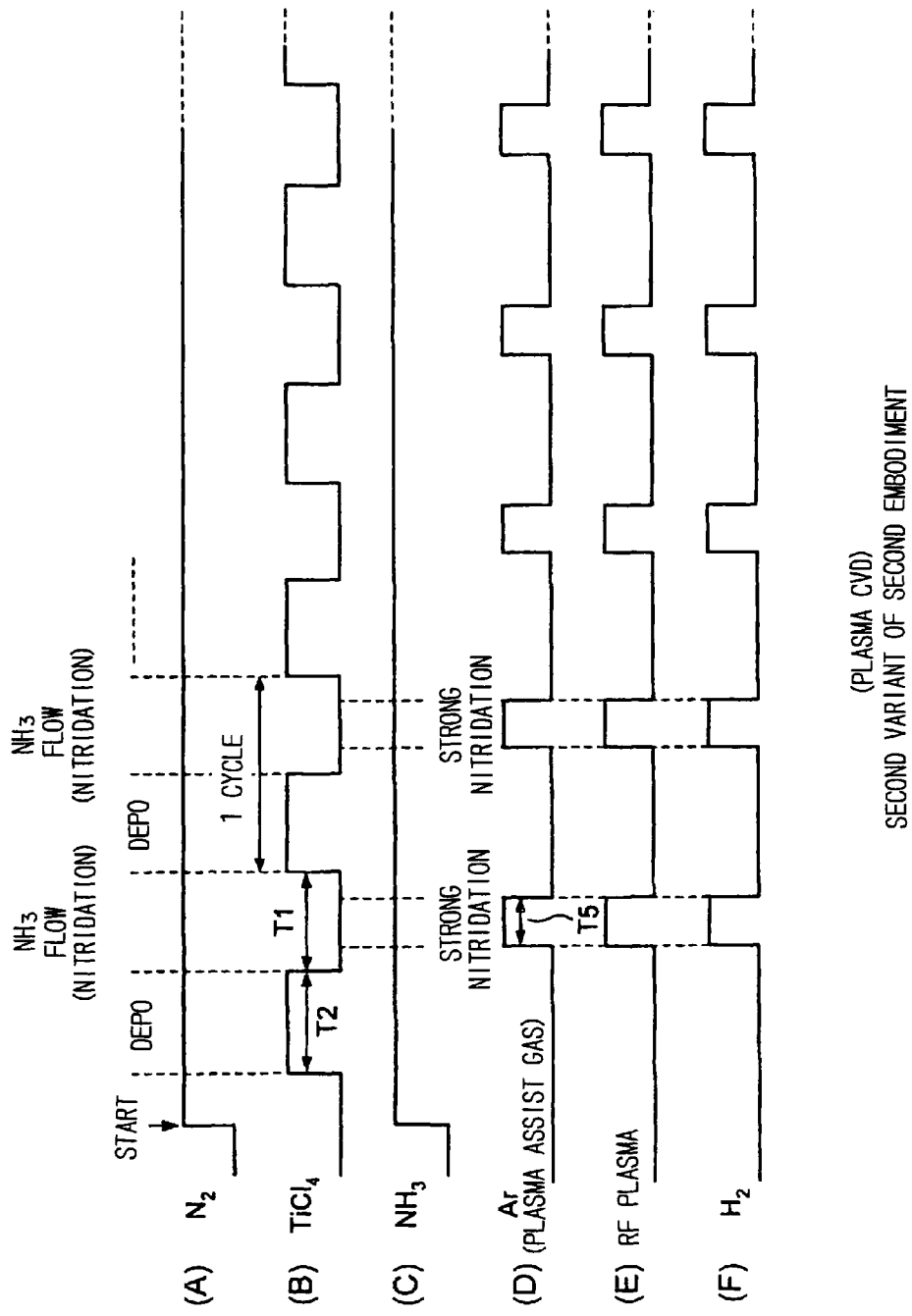
FIG. 11 is a chart showing timings of supply of various gases and timings of generation of plasma, in a second variant of the second embodiment.

FIG. 11 is a chart showing timings of supply of various gases and timings of generation of plasma, in the second variant of the second embodiment. The explanation of the same gases as in FIG. 9 is omitted.

The feature of the variant is that a TiN film is deposited by a plasma CVD: by adding a plasma assist gas, for example an Ar gas (see FIG. 11(D)), so as to generate plasma; and at that time by adding a reduction gas, for example an $H_2$ gas (see FIG. 11(F)), if necessary; in addition to the gas supplying manner of the second embodiment.

That is, during the non-supply terms T1 of the $TiCl_4$ gas as the metal source gas, for terms T5 shorter than the non-supply terms T1, the Ar gas as the plasma assist gas is supplied so as to generate the plasma. Herein, the supply term T5 of the Ar gas is set at substantially the center of the non-supply term T1 of the $TiCl_4$ gas. Then, the Ar gas is supplied, and a high-frequency electric voltage is applied to the upper electrode 16, so as to generate the plasma. Thus, nitriding power to the TiN film is further enhanced, and thus a more complete TiN film whose chlorine density is smaller can be formed. In addition, when the plasma is generated, as shown in FIG. 11(F), the $H_2$ gas as the reduction gas can be supplied so as to improve the nitriding power further more.

In addition, in the case as well, the high-frequency electric voltage can be applied to both the upper electrode 16 and the lower electrode 40.

Next, a third embodiment of the present invention is explained.

Figure 12:
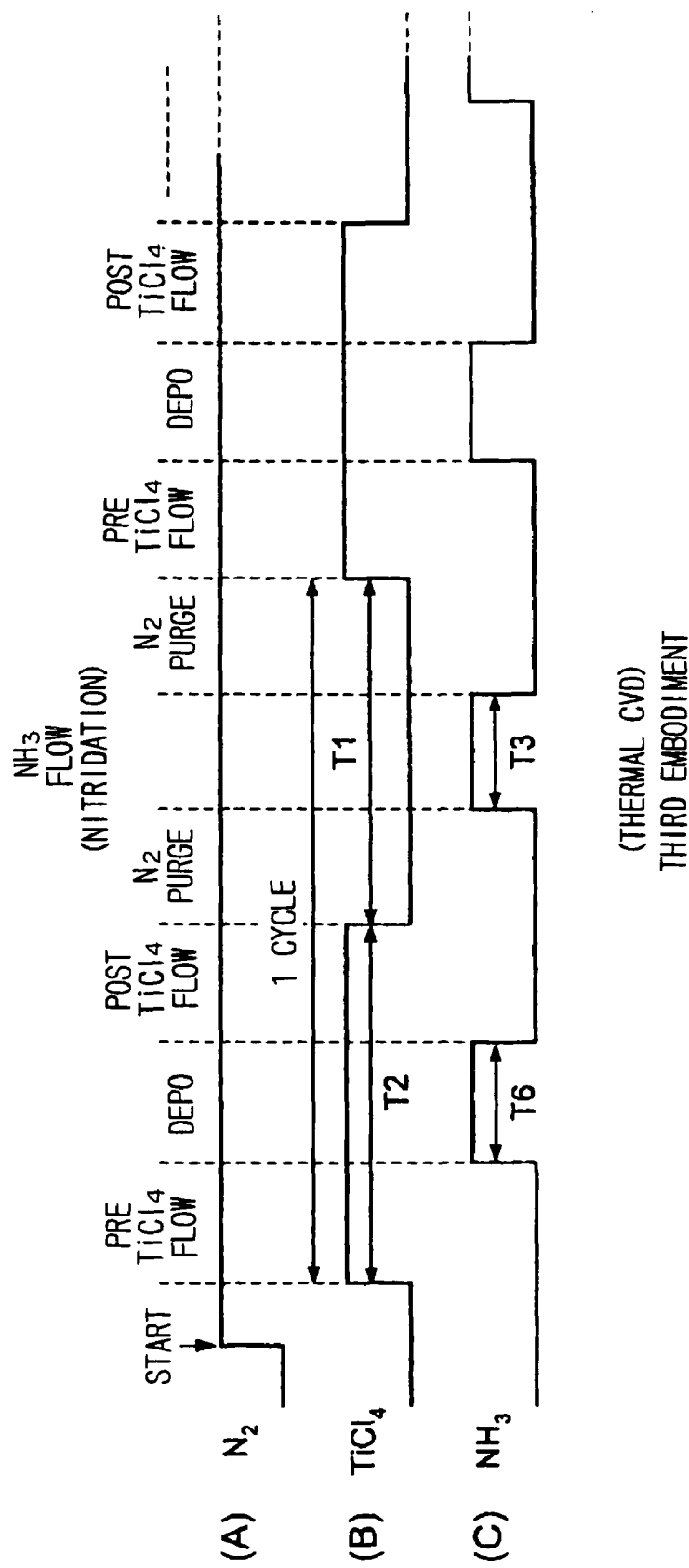
FIG. 12 is a chart showing timings of supply of various gases in a third embodiment according to the present invention.

FIG. 12 is a chart showing timings of supply of various gases in the third embodiment according to the present invention.

Herein, an inert gas is continuously supplied, while a metal source gas is intermittently supplied. A nitrogen-including reduction gas is supplied during the supply terms T2 of the metal source gas, for terms T6 shorter than the supply terms T2, and also during the non-supply terms T1 of the metal source gas, for terms T3 shorter than the non-supply terms T1.

That is, an $N_2$ gas as the inert gas is continuously supplied, while a $TiCl_4$ gas as the metal source gas is intermittently supplied in accordance with a pulse-pattern in time. In addition, the $NH_3$ gas as the nitrogen-including reduction gas is supplied in accordance with a pulse-pattern in time, that is, for the terms T6 and T3 that are respectively shorter than the supply terms T2 and the non-supply terms T1 of the $TiCl_4$ gas, during the supply terms T2 and the non-supply terms T1 of the $TiCl_4$ gas. That is, there are a PRE-FLOW term and a POST-FLOW term of the $TiCl_4$ gas before and after the DEPO step. Thus, flow rate of the $TiCl_4$ gas is stabilized, and a TiN film is deposited by a thermal CVD. Then, a step cycle of PRE $TiCl_4$ FLOW→DEPO→POST $TiCl_4$ FLOW→$N_2$ PURGE→$NH_3$ FLOW (nitridation)→$N_2$ PURGE (→PRE $TiCl_4$ FLOW→DEPO→POST $TiCl_4$ FLOW→$N_2$ PURGE) ... is repeated in sequence. In the case shown in FIG. 12, the supply term T6 of the $NH_3$ gas during the supply term T2 of the $TiCl_4$ gas is set at substantially the center of the supply term T2 of the $TiCl_4$ gas, and the supply term T3 of the $NH_3$ gas during the non-supply term T1 of the $TiCl_4$ gas is set at substantially the center of the non-supply term T1 of the $TiCl_4$ gas. In addition, the term of the cycle is for example about 15 to 70 seconds.

In the third embodiment as well, it is possible to lower chlorine density that may be contained in the TiN film, even at a relatively low process temperature, by intermittently depositing a plurality of very thin films in sequence by intermittently supplying the film-forming gas. In addition, the TiN film can have a low resistivity, less cracks may occur in the TiN film, and abnormal growth of the TiN film may be also inhibited.

In the case of the third embodiment, the PRE-FLOW step of the $TiCl_4$ gas and the POST-FW step of the $TiCl_4$ gas are provided before and after the DEPO step so that the flow rate of the $TiCl_4$ gas is stabilized. In addition, the $N_2$ PURGE steps are provided before and after the $NH_3$ FLOW (nitridation) step, so as to completely discharge redundant gases. Therefore, step coverage may be improved more.

Next, a first variant of the third embodiment is explained.

FIG. 13 is a chart showing timings of supply of various gases in the first variant of the third embodiment. The explanation of the same gases as in FIG. 12 is omitted.

The feature of the variant is that a TiN film is deposited by a thermal CVD by supplying a second nitrogen-including reduction gas, for example a monomethylhydrazine gas (see FIG. 13(D)), in addition to the gas supplying manner of the third embodiment.

That is, during the non-supply terms T1 of the $TiCl_4$ gas as the metal source gas, at the same time that the $NH_3$ gas as the nitrogen-including reduction gas is supplied, the MMH gas as the second nitrogen-including reduction gas whose reducing power is greater than that of the nitrogen-including reduction gas is adapted to be supplied.

By using a gas whose reducing power is greater than that of the $NH_3$ gas, like the MMH gas, as the second nitrogen-including reduction gas, nitiriding power can be improved when the gas is supplied. Thus, the chlorine density can be more reduced, so that a more complete TiN film can be formed.

Next, a second variant of the third embodiment is explained.

FIG. 14 is a chart showing timings of supply of various gases and timings of generation of plasma, in the second variant of the third embodiment. The explanation of the same gases as in FIG. 12 is omitted.

The feature of the variant is that a TiN film is deposited by a plasma CVD: by adding a plasma assist gas, for example an Ar gas (see FIG. 14(D)), so as to generate plasma; and at that time by adding a reduction gas, for example an $H_2$ gas (see FIG. 14(F)), if necessary; in addition to the gas supplying manner of the third embodiment.

That is, during the non-supply terms T1 of the TiCl$_4$ gas as the metal source gas, at the same time that the nitrogen-including reduction gas is supplied, the Ar gas as the plasma assist gas is supplied so as to generate the plasma. In the case, the Ar gas is supplied only while the NH$_3$ FLOW is conducted, and a high-frequency electric voltage is applied to the upper electrode 16 so as to generate the plasma. Thus, nitriding power to the TiN film is further enhanced, and thus a more complete TiN film whose chlorine density is smaller can be formed. In addition, when the plasma is generated, as shown in FIG. 14(F), the H$_2$ gas as the reduction gas can be supplied so as to improve the nitriding power further more.

In addition, in the case as well, the high-frequency electric voltage can be applied to both the upper electrode 16 and the lower electrode 40.

Next, a fourth embodiment of the present invention is explained.

Figure 15:
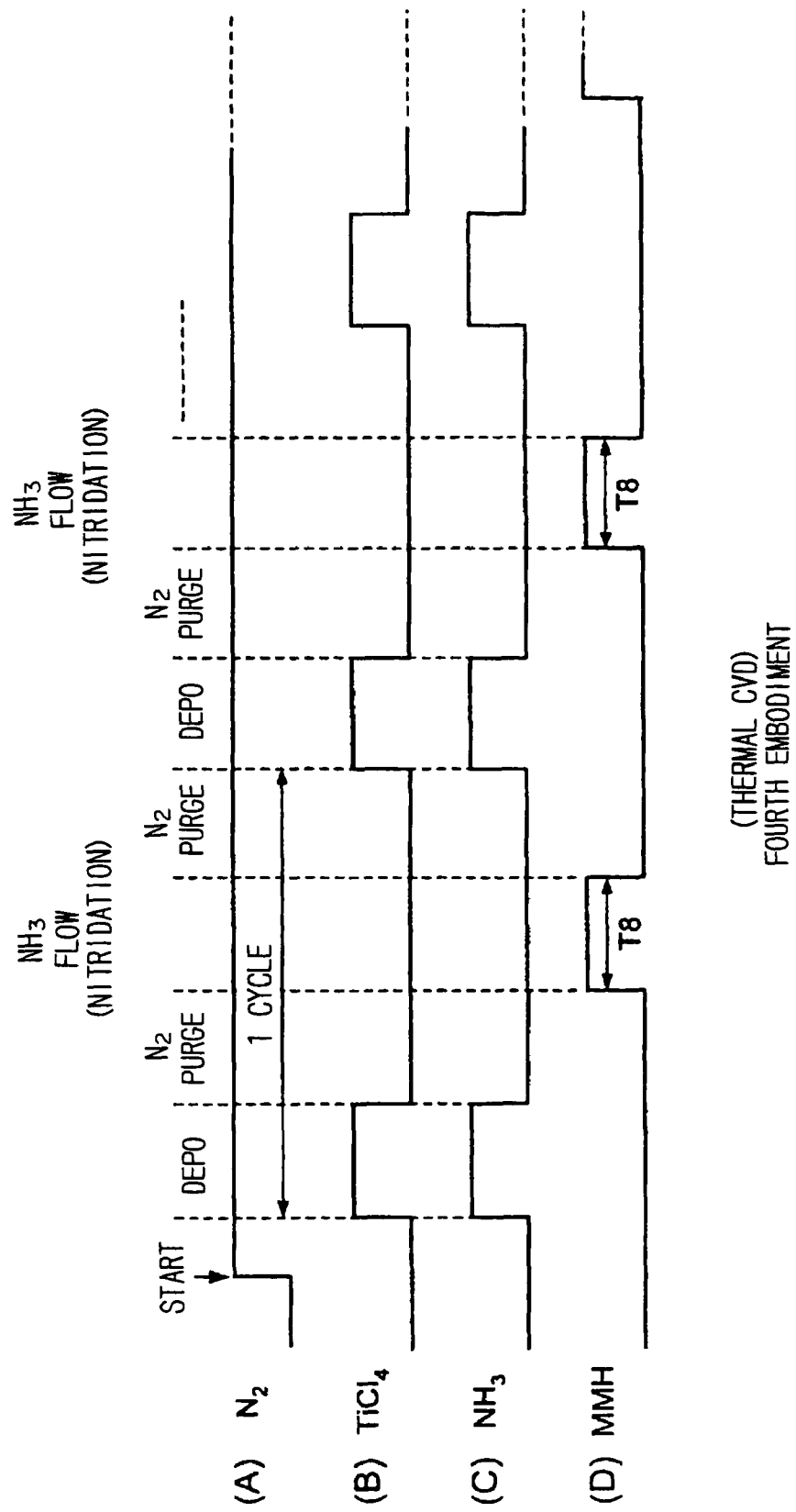
FIG. 15 is a chart showing timings of supply of various gases in a fourth embodiment according to the present invention.

FIG. 15 is a chart showing timings of supply of various gases in the fourth embodiment according to the present invention.

Herein, an inert gas is continuously supplied, a metal source gas is intermittently supplied, and a nitrogen-including reduction gas is supplied at the same time that the metal source gas is supplied. In addition, a second nitrogen-including reduction gas is supplied during non-supply terms of the metal source gas, for terms shorter than the non-supply terms. Thus, a TiN film is deposited by a thermal CVD.

That is, an N$_2$ gas as the inert gas is continuously supplied, while a TiCl$_4$ gas as the metal source gas and an NH$_3$ gas as the nitrogen-including reduction gas are synchronously and intermittently supplied in accordance with a pulse-pattern in time. In addition, during the non-supply terms of the TiCl$_4$ gas, for terms shorter than the non-supply terms, a MMH gas as the second nitrogen-including reduction gas, whose reducing power is greater than that of the NH$_3$ gas, is supplied. Thus, the TiN film is deposited by the thermal CVD. That is, the TiN film is nitrided when the MMH gas is supplied (reduction of the chlorine is carried out).

The fourth embodiment is a gas supplying manner corresponding to that wherein the supply terms T3 of the NH$_3$ gas are removed from the first variant of the first embodiment shown in FIG. 7. Thus, the supply terms T3 in FIG. 7 correspond to the supply terms T8 of the MMH gas in FIG. 15. Thus, a step cycle of DEPO→N$_2$ PURGE→MMH FLOW (nitridation)→N$_2$ PURGE (→DEPO→N$_2$ PURGE→MMH FLOW (nitridation)) . . . is repeated in sequence.

In the fourth embodiment as well, it is possible to lower chlorine density that may be contained in the TiN film, even at a relatively low process temperature, by intermittently depositing a plurality of very thin films in sequence by intermittently supplying the film-forming gas. In addition, the TiN film can have a low resistivity, less cracks may occur in the TiN film, and abnormal growth of the TiN film may be also inhibited.

In addition, the term of the cycle is for example about 10 to 60 seconds.

Next, a fifth embodiment of the present invention is explained.

FIG. 16 is a chart showing timings of supply of various gases and timings of generation of plasma, in the fifth embodiment according to the present invention.

Herein, an inert gas is continuously supplied, a metal source gas is intermittently supplied, and a nitrogen-including reduction gas is supplied at the same time that the metal source gas is supplied. In addition, a plasma assist gas is supplied during non-supply terms of the metal source gas, for terms shorter than the non-supply terms and continuous to the next supply terms of the metal-source gas, so as to generate plasma.

That is, an N$_2$ gas as the inert gas is continuously supplied, while a TiCl$_4$ gas as the metal source gas and an NH$_3$ gas as the nitrogen-including reduction gas are synchronously and intermittently supplied in accordance with a pulse-pattern in time. In addition, during the non-supply terms T1 of the TiCl$_4$ gas, for shorter terms T9 continuous to the next supply terms T2 of the TiCl$_4$ gas, an Ar gas as the plasma assist gas (see FIG. 16(D)) is added to generate the plasma (see FIG. 16(E)).

In addition, if necessary, a reduction gas, for example an H$_2$ gas (see FIG. 16(F)), is added at that time, so that a TiN film is deposited by a plasma CVD. Thus, a step cycle of DEPO→N$_2$ PURGE→plasma nitridation (→DEPO→N$_2$ PURGE→plasma nitridation) . . . is repeated in sequence.

In the case of the present embodiment, when the Ar gas is supplied, a high-frequency electric voltage is applied to the upper electrode 16 so as to generate the plasma. Thus, nitriding power to the TiN film is further enhanced, and thus a more complete TiN film whose chlorine density is smaller can be formed. In addition, when the plasma is generated, as shown in FIG. 16(F), the H$_2$ gas as the reduction gas can be supplied so as to improve the nitriding power further more.

In addition, in the case as well, the high-frequency electric voltage can be applied to both the upper electrode 16 and the lower electrode 40.

In the fifth embodiment as well, it is possible to lower chlorine density that may be contained in the TiN film, even at a relatively low process temperature, by intermittently depositing a plurality of very thin films in sequence by intermittently supplying the film-forming gas. In addition, the TiN film can have a low resistivity, less cracks may occur in the TiN film, and abnormal growth of the TiN film may be also inhibited.

In addition, in the present embodiment, the NH$_3$ gas is not supplied during the plasma nitriding step (term T9). Thus, the plasma nitridation is conducted by the N$_2$ purge gas, so that the DEPO step (term T2) can be immediately conducted without necessity to conduct any N$_2$ PURGE step for discharging the NH$_3$ gas just after the plasma nitriding step. Thereby, throughput may be improved. In addition, the term of the cycle of the present embodiment is about 5 to 60 seconds.

In the above embodiments, the MMH gas is used as the second nitrogen-including reduction gas whose reducing power is great. However, this invention is not limited thereto, but other gases such as hydrazine or dimethylhydrazine may be also used.

In addition, in the above explanation, the TiN film is deposited as a metal-nitride film. However, this invention is not limited thereto, but applicable to cases for depositing other metal-nitride films such as a WN film or a TaN film.

In addition, in the above embodiments, the semiconductor wafer is taken as an example of the object to be processed. However, this invention is not limited thereto, but applicable to cases for processing a glass substrate, an LCD substrate, and the like.

The invention claimed is:

1. A film-forming method of forming a metal-nitride film onto a surface of an object to be processed in a processing container in which a vacuum can be created, the film-forming method comprising:

continuously supplying an inert gas into a processing container; and while supplying the inert gas into the container, cyclically supplying a metal-source gas into the processing container, each cycle of metal-source gas supply having a supply term and a non-supply term, wherein
during the supply term of the metal-source gas, a nitrogen-including reduction gas continuously is supplied into the processing container for a term shorter than the supply term of the metal-source gas, and
during the non-supply term of the metal-source gas, the nitrogen-including reduction gas continuously is supplied into the processing container for a term shorter than the non-supply term of the metal-source gas.

2. A film-forming method according to claim 1, wherein the step of continuously supplying the inert gas into the processing container is conducted while a film-forming temperature is set at a temperature within the range of 150 C.° to 450 C.°.

3. A film-forming method according to claim 1, wherein during the step of supplying the nitrogen-including reduction gas into the processing container for a term shorter than a non-supply term of the metal-source gas, during the non-supply term of the metal-source gas, a second nitrogen-including reduction gas, whose reducing power is greater than that of the nitrogen-including reduction gas, is supplied at the same time that the nitrogen-including reduction gas is supplied.

4. A film-forming method according to claim 3, wherein the second nitrogen-including reduction gas is any of hydrazine, monomethylhydrazine and dimethylhydrazine.

5. A film-forming method according to claim 1, wherein the metal-source gas is $TiCl_4$ gas, and
the nitrogen-including reduction gas is $NH_3$ gas.

6. A film-forming method according to claim 1, wherein the inert gas is $N_2$ gas.

7. A film-forming method according to claim 1, wherein the inert gas is Ar gas.

8. A film-forming method according to claim 1, wherein the nitrogen-including reduction gas is supplied at least during a middle of the non-supply term of the metal source gas.

9. The film forming method according to claim 1, wherein, during the metal-source gas supply term, the supply term of the nitrogen-including reduction gas begins substantially after the metal-source gas supply term begins, and ends substantially before the metal-source gas supply term ends.

10. The film forming method according to claim 9, wherein, during the metal-source gas non-supply term, the supply term of the nitrogen-including reduction gas begins substantially after the metal-source gas non-supply term begins, and ends substantially before the metal-source gas non-supply term ends.

11. A film-forming method according to claim 10, wherein the nitrogen-including reduction gas is supplied at least during a middle of the non-supply term of the metal source gas.

12. The film forming method according to claim 10, wherein the supply term of the nitrogen-including reduction gas into the processing container is set at substantially the center of the supply term of the metal-source gas.

13. The film forming method according to claim 1, wherein, during the metal-source gas non-supply term, the supply term of the nitrogen-including reduction gas begins substantially after the metal-source gas non-supply term begins, and ends substantially before the metal-source gas non-supply term ends.

14. The film forming method according to claim 1, wherein the supply term of the nitrogen-including reduction gas into the processing container is set at substantially the center of the supply term of the metal-source gas.

* * * * *